US008183782B2

(12) United States Patent
Kloss et al.

(10) Patent No.: US 8,183,782 B2
(45) Date of Patent: May 22, 2012

(54) HIGH-PRESSURE DISCHARGE LAMP WITH IMPROVED IGNITABILITY AND HIGH-VOLTAGE PULSE GENERATOR

(75) Inventors: Andreas Kloss, Neubiberg (DE); Ute Liepold, Munchen (DE); Carsten Schuh, Baldham (DE); Thorsten Steinkopff, Egmating (DE); Klaus Stockwald, Germering (DE); Steffen Walter, Oberpframmern (DE)

(73) Assignee: Osram AG, Munich (DE)

( * ) Notice: Subject to any disclaimer, the term of this patent is extended or adjusted under 35 U.S.C. 154(b) by 567 days.

(21) Appl. No.: 12/086,879

(22) PCT Filed: Dec. 22, 2006

(86) PCT No.: PCT/EP2006/069375
§ 371 (c)(1),
(2), (4) Date: Jun. 9, 2009

(87) PCT Pub. No.: WO2007/071561
PCT Pub. Date: Jun. 28, 2007

(65) Prior Publication Data
US 2009/0261730 A1 Oct. 22, 2009

(30) Foreign Application Priority Data
Dec. 23, 2005 (DE) .......................... 10 2005 061 832

(51) Int. Cl.
*H01J 13/46* (2006.01)
*H05B 41/16* (2006.01)
(52) U.S. Cl. ............... 315/56; 315/58; 315/60; 315/246
(58) Field of Classification Search .................... 315/56, 315/58, 60, 73, 74, 209 CD, 238, 241 R, 315/DIG. 7; 313/553, 607, 567, 642
See application file for complete search history.

(56) References Cited

U.S. PATENT DOCUMENTS

| 3,004,197 | A |   | 10/1961 | Rodriguez et al. |
| 3,289,015 | A |   | 11/1966 | Fitch et al. |
| 4,015,164 | A | * | 3/1977 | Fischer et al. ................. 313/642 |
| 4,325,004 | A |   | 4/1982 | Proud et al. |
| 4,353,012 | A |   | 10/1982 | Fallier, Jr. et al. |
| 4,724,362 | A | * | 2/1988 | Lester ........................... 315/289 |
| 5,336,974 | A | * | 8/1994 | Luijks et al. .................... 315/58 |
| 5,567,995 | A |   | 10/1996 | O'Loughlin et al. |
| 5,990,599 | A | * | 11/1999 | Jackson et al. ................... 313/25 |
| 6,661,177 | B2 | * | 12/2003 | Luijks et al. .................... 315/60 |
| 6,844,676 | B2 | * | 1/2005 | Alderman et al. ............. 313/567 |
| 6,861,805 | B2 | * | 3/2005 | Jackson et al. ................ 313/607 |
| 6,995,513 | B2 | * | 2/2006 | Alderman et al. ............. 313/607 |
| 7,132,800 | B2 | * | 11/2006 | Van Esveld et al. ............ 315/60 |
| 7,635,949 | B2 | * | 12/2009 | De Maagt et al. ............. 313/553 |
| 2010/0026202 | A1 | * | 2/2010 | Siessegger .................... 315/287 |

FOREIGN PATENT DOCUMENTS

| DE | 1439600 A1 | 10/1968 |
| EP | 0 049 465 A2 | 4/1982 |
| EP | 1 173 050 A2 | 1/2002 |
| EP | 0817215 B1 | 11/2003 |
| JP | 6290755 A | 10/1994 |
| WO | 03059025 A2 | 7/2003 |

OTHER PUBLICATIONS

English abstract of DE 1439600 A1. R.C. Weast, "CRC Handbook of Chemistry and Physics" 63rd Edition, CRC Press Inc., Boca Raton, Florida, XP002538669, pp. E56.
European Search Report of 09158192.6 dated Aug. 6, 2009.
English Abstract of JP 6290755 A.

* cited by examiner

*Primary Examiner* — Vibol Tan

(57) ABSTRACT

High pressure discharge lamp (20) with improved ignitability. A spiral pulse generator (1) that is directly mounted inside the outer piston (12) of the lamp is used for igniting the high pressure discharge lamp.

5 Claims, 6 Drawing Sheets

HIGH-PRESSURE DISCHARGE LAMP WITH IMPROVED IGNITABILITY AND HIGH-VOLTAGE PULSE GENERATOR

TECHNICAL FIELD

The invention is based on a high-pressure discharge lamp with a discharge vessel, which is accommodated in an outer bulb and is held there by a frame, an ignition apparatus being integrated in the lamp which generates high-voltage pulses in the lamp. Such lamps are in particular high-pressure discharge lamps for general lighting or for photooptical purposes or for motor vehicle lighting. The invention furthermore relates to a high-voltage pulse generator which can be used in particular for a lamp.

PRIOR ART

The problem associated with the ignition of high-pressure discharge lamps is at present solved by virtue of the fact that the ignition device is integrated in the ballast. One disadvantage with this is the fact that the feed lines need to be designed to be resistant to high voltages.

In the past, repeated attempts have been made to integrate the ignition unit in the lamp. These attempts involve integrating it in the base. Particularly effective ignition which promises high pulses is achieved by means of so-called spiral pulse generators; see U.S. Pat. No. 3,289,015. Quite some time ago such devices were proposed for different high-pressure discharge lamps, such as metal-halide lamps or sodium high-pressure lamps; see U.S. Pat. No. 4,325,004, U.S. Pat. No. 4,353,012, for example. However, they could not be implemented because, for one reason, they are too expensive. Secondly, the advantage of integrating them in the base is insufficient since the problem of supplying the high voltage into the bulb remains. The probability of damage to the lamp, whether it be insulation problems or a rupture in the base, therefore increases considerably. Ignition devices which have been conventional to date generally could not be heated to above 100° C. The voltage generated then needed to be supplied to the lamp, which necessitates lines and lampholders with a corresponding resistance to high voltages, typically approximately 5 kV.

DESCRIPTION OF THE INVENTION

The object of the present invention is to provide a high-pressure discharge lamp whose ignition response is markedly improved in comparison with previous lamps and with which there is no danger of any damage as a result of the high voltage. This applies in particular to metal-halide lamps, with it being possible for the material of the discharge vessel to either be quartz glass or ceramic.

This object is achieved by the characterizing features that the ignition apparatus is accommodated in the outer bulb.

Particularly advantageous configurations are given in the dependent claims.

Furthermore, an object of the present invention is to specify a compact high-voltage pulse generator. This object is achieved by a compact high-voltage pulse generator based on a spiral pulse generator, characterized in that the spiral pulse generator is in the form of an LTCC assembly or HTCC assembly comprising ceramic films and metallic conductive paste.

According to the invention, a high-voltage pulse with at least 1.5 kV, which is required for igniting the lamp, is now generated by means of a special temperature-resistant spiral pulse generator, which is integrated in the immediate vicinity of the discharge vessel in the outer bulb. Not only cold-starting but also hot-restarting is therefore possible.

The spiral pulse generator now used is in particular a so-called LTCC assembly. This means that it is produced from ceramic with an LTCC (Low Temperature Co-fired Ceramics) capability. This material is a special ceramic, which can be made temperature-resistant up to 600° C. Although LTCC has already been used in connection with lamps, see U.S. 2003/0001519 and U.S. Pat. No. 6,853,151, it has been used for entirely different purposes in lamps which are virtually hardly subjected to temperature loading at all, with typical temperatures of below 100° C. The particular value of the high temperature stability of LTCC in connection with the ignition of high-pressure discharge lamps, such as primarily metal-halide lamps with ignition problems, cannot be found in the prior art.

The spiral pulse generator is an assembly which combines the properties of a capacitor with those of a waveguide for generating ignition pulses with a voltage of at least 1.5 kV. For production purposes, two ceramic "green films" with a metallic conductive paste are printed and then wound in offset fashion to form a spiral and finally pressed isostatically to form a molding. The subsequent co-sintering of metal paste and ceramic film takes place in air in the temperature range of between 800 and 1100° C., in particular in the range of from 800 to 900° C. This processing allows for a use range of the spiral pulse generator with a temperature loading of up to typically 700° C. As a result, the spiral pulse generator can be accommodated in the direct vicinity of the discharge vessel in the outer bulb, but also in the base or in the immediate vicinity of the lamp.

However, for the production of spiral pulse generators it is also possible to use ceramic "green films" with metallic conductive paste which belong to the range of sintering temperatures of HTCC (High Temperature Co-fired Ceramics) materials. These are, for example: $Al_2O_3$, $ZrO_2$ etc. This class of materials is densely sintered in the high temperature range of between 1100 and 1800° C.

The sintering can also take place in nitrogen ($N_2$), Argon (Ar) or hydrogen ($H_2$) or mixtures thereof, with different gas compositions and mixing ratios.

For the production of the spiral pulse generator, preferably ceramic green films can be used which, after the sintering, have a relative dielectric constant (D.C.) epsilon ($\in$) of from 5 to 20 000. This allows for a very high capacitance of the spiral capacitor, and in addition a comparatively large width of the high-voltage pulse generated. In practice, good values for D.C. are $\in$=10 to 100.

A very compact design is thus possible, which makes it possible to integrate the spiral pulse generator directly in the outer bulb of a lamp or in its base. The high pulse width also favors the flashover in the plasma of the discharge vessel.

Preferably all paste systems which have at least one metallic component and which conduct electrical current after the sintering process are suitable as a metal coating for the film. These are preferably:

Ag, Au, Cu, Mo, Ni, Pt, mixtures of Ag and Pd in accordance with the composition $Ag_xPd_{1-x}$. In this case, x is preferably in the range of from 0.5 to 0.99.

The metal coating can also be laminated in the form of metallic foils onto the ceramic substrates. The thickness of the foils is preferably in the range of from 1 to 100 µm. In this case, the foil can be applied prior to or during the shaping winding process.

A suitable nonmetallic substance system for a conductive coating is graphite.

A nonmetallo-inorganic substance system for a conductive coating are electrically conductive ceramics or cermets.

In principle preferably all ceramic substance systems from which ceramic green films can be drawn over a slip are suitable for the production of spiral pulse generators. The ceramic substance systems (nonmetallo-inorganic) in the initial state have a D.C. of between $\in_r=5$ and $\in_r=20\,000$. However, substance systems and mixtures in which at least one component represents a ceramic substance system are also suitable. These are in particular the substances in Table 1.

TABLE 1

| Material | D.C. $E_r$ (approx.) |
| --- | --- |
| Ceramic substrates using LTCC technology | 3 to 10000 |
| Conventional materials for capacitor manufacture | 10 to 20000 |
| Materials from the group consisting of barium titanates and Ba—Sr titanates | 500 to 12000, in partic. 3000 to 7000 |
| Materials from the group consisting of barium zirconate titanates | 15000 to 21000 |
| Materials from the group consisting of lead zirconate titanates, so-called PZT, in partic. hard and soft PZTs | 1500 to 2500 |
| PZTs with additives | 8000 to 9500 |
| Materials from the group consisting of lead magnesium niobates, so-called PMNs | 18000 to 20000 |
| Materials from the group consisting of lead zinc niobates, so-called PZNs | 17000 to 20500 |
| Materials from the group consisting of potassium sodium niobates, so-called KNNs | 700 to 1200 |
| Materials from the group consisting of bismuth-based perovskites | 800 to 1150 |
| Materials from the group consisting of tungsten bronzes | 800 to 1200 |

The advantages of such a choice of materials are:
- high use temperature, with the result that the spiral pulse generator can be installed in the immediate vicinity of the lamp, in its base or even in its outer bulb;
- small physical shape;
- feed lines which are resistant to high voltages are no longer required;
- high energy storage capacity and resultant high ignition pulse energy;
- the pulse width for starting a high-pressure discharge lamp can be increased depending on the D.C., typical resulting pulse widths being from 50 to 200 ns;
- the charging voltage can be increased depending on the turns number by a factor of from 5 to 200.

A specific spiral pulse generator is manufactured, for example, from ceramic LTCC material with an $\in$ of 65. The tape length is from 50 cm to 110 cm. The metal coating is a conductive paste consisting of Au. The resultant spiral pulse generator has, for example, an outer diameter of approximately from 1.4 cm to 2.5 cm.

Independently of this, such a spiral pulse generator can also be used for other applications because it is not only stable at high temperatures but is also extremely compact. It is essential for this purpose that the spiral pulse generator is in the form of an LTCC assembly, comprising ceramic films and metallic conductive paste. In order to provide sufficient output voltage, the spiral should comprise at least 5 turns.

In addition, on the basis of this high-voltage pulse generator an ignition unit can be specified which furthermore comprises at least one charging resistor and a switch. The switch may be a spark gap or else a diac using SiC technology.

It is preferable in the case of an application for lamps for it to be accommodated in the outer bulb. This is because this dispenses with the need for a voltage feed line which is resistant to high voltages.

In addition, a spiral pulse generator can be dimensioned such that the high-voltage pulse even allows for hot-restarting of the lamp. The dielectric made from ceramic is characterized by an extremely high dielectric constant $\in_r$ in the range of $\in_r>10$, with it being possible for an $\in$ of typically $\in=70$ to 100 to be achieved depending on the material and construction. This allows for a very high capacity of the spiral pulse generator and allows for a comparatively large temporal width of the pulses generated. As a result, a very compact design of the spiral pulse generator is possible, with the result that it can be integrated in conventional outer bulbs of high-pressure discharge lamps.

The high pulse width also facilitates the flashover in the discharge volume.

Any conventional glass can be used as the material of the outer bulb, i.e. in particular hard glass, vycor or quartz glass. The choice of filling is also not subject to any particular restriction.

BRIEF DESCRIPTION OF THE DRAWINGS

The invention will be explained in more detail below with reference to a plurality of exemplary embodiments. In the figures.

PREFERRED EMBODIMENT OF THE INVENTION

Figure 1:
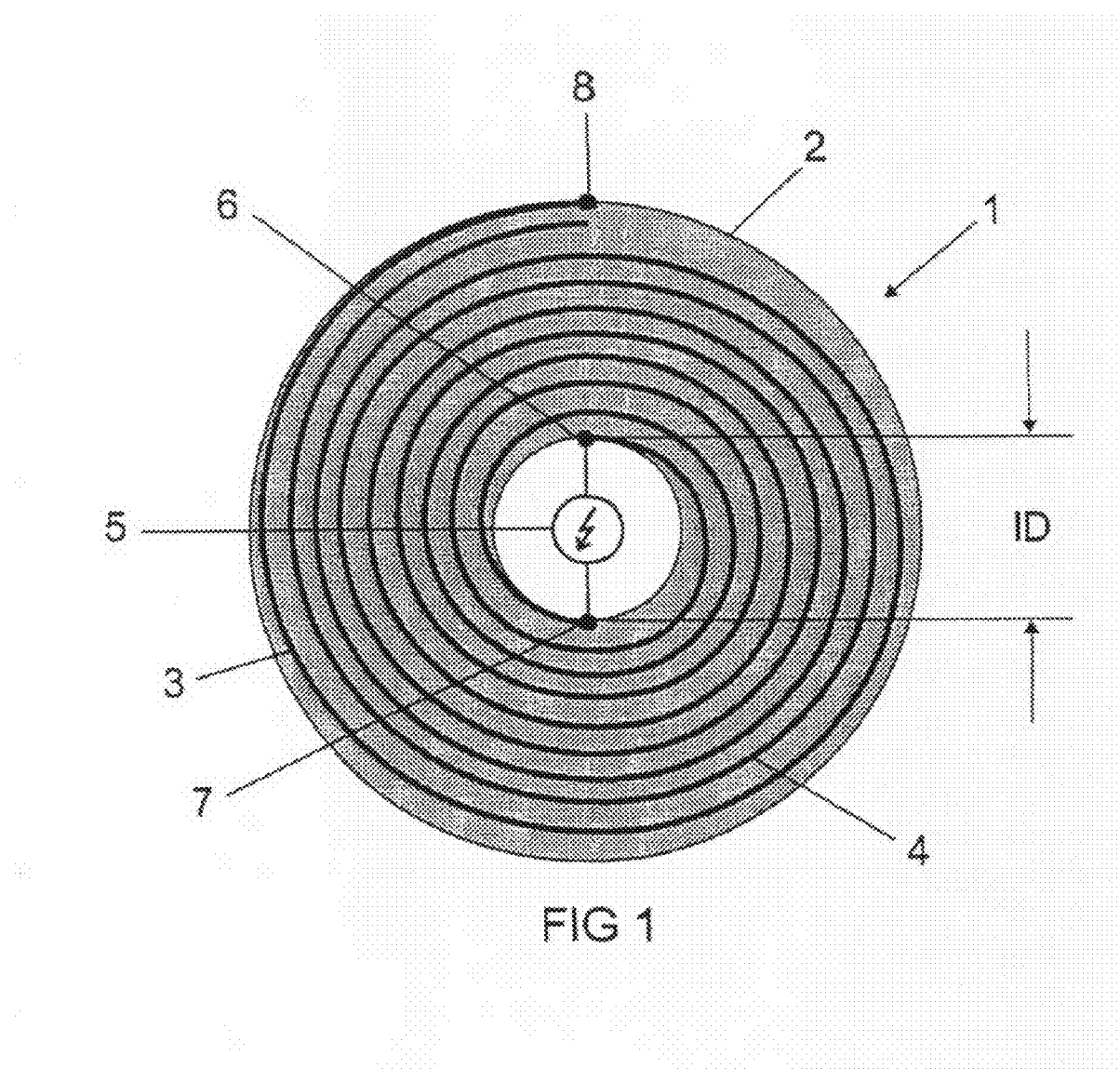
FIG. 1 shows the basic design of a spiral pulse generator.

FIG. 1 shows the design of a spiral pulse generator 1 in a plan view. It comprises a ceramic cylinder 2, into which two different metallic conductors 3 and 4 are wound in spiral fashion. The cylinder 2 is hollow on the inside and has a given inner diameter ID. The two inner contacts 6 and 7 of the two conductors 3 and 4 are adjacent to one another and are connected to one another via a spark gap 5.

Only the outer one of the two conductors has a further contact 8 on the outer edge of the cylinder. The other conductor ends open. The two conductors thereby together form a waveguide with an open end, the waveguide being realized in a dielectric medium, the ceramic.

The spiral pulse generator is either wound from two ceramic films coated with metal paste or constructed from two metal foils and two ceramic green films. An important characteristic in this case is the number n of turns, which should preferably be of the order of magnitude of from 5 to 100. This coil arrangement is laminated and subsequently co-sintered, which results in a ceramic assembly, in particular an LTCC assembly. The spiral pulse generators created in such a way with a capacitor property are then connected to a spark gap and a charging resistor.

The spark gap can be located at the inner or the outer terminals or else within the winding of the generator. A spark gap can preferably be used as the high-voltage switch which initiates the pulse. Furthermore, the use of a semiconductor switch which is resistant to high temperatures, preferably using SiC technology, is possible. For example, the switching element MESFET by Cree can be used. This is suitable for temperatures of up to 350° C.

In a specific exemplary embodiment, a ceramic material where $\in=60$ to $70$ is used. The dielectric used here is preferably a ceramic film, in particular a ceramic strip such as Heratape CT 700 or CT 707 or preferably CT 765, each by Heraeus, or else a mixture of at least two of these. The thickness of the green film is typically from 50 to 150 μm. The conductor used is in particular Ag conductive paste such as "Cofirable Silver", likewise by Heraeus. A specific example is TC 7303 by Heraeus. Good results are also achieved with the metal paste 6142 by DuPont. These parts can be laminated effectively and then burnt out ("binder burnout") and sintered together ("co-firing").

The inner diameter ID of the specific spiral pulse generator is 10-14 mm. The width of the individual strips is approximately 6 to 9 mm. The film thickness is 50-80 μm and the thickness of the two conductors is in each case 7 to 12 μm. With a charging voltage of 300 V this generator generates 2500 V. Under these conditions, the spiral pulse generator achieves an optimum for its properties with a turns number of approximately n=19.

Figure 2:
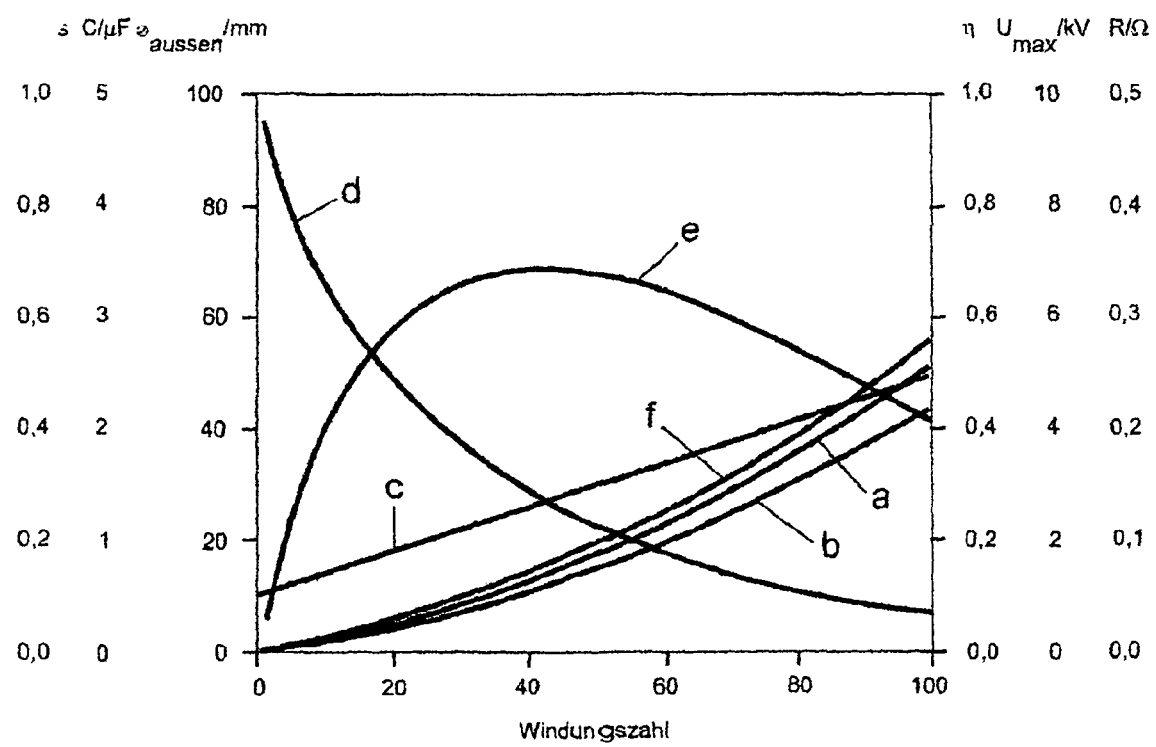
FIG. 2 shows characteristics of an LTCC spiral pulse generator.

FIG. 2 illustrates the associated full width at half maximum of the high-voltage pulse in μs (curve a), the total capacitance of the assembly in μF (curve b), the resultant outer diameter in mm (curve c), and the efficiency (curve d), the maximum pulse voltage (curve e) in kV and the conductor resistance in $\Omega$ (curve f).

Figure 3:
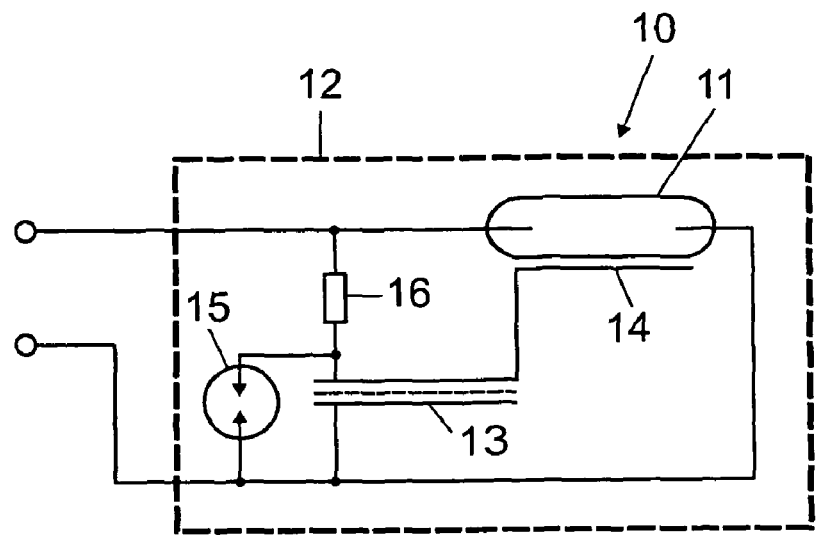
FIG. 3 shows the basic design of a high-pressure discharge lamp with a third ignition electrode with a spiral pulse generator in the outer bulb.

FIG. 3 shows the basic design of a high-pressure discharge lamp, in particular a sodium high-pressure lamp 10, with a ceramic discharge vessel 11 and an outer bulb 12 with a spiral pulse generator 13 integrated therein, an ignition electrode 14 being fitted on the outside on the ceramic discharge vessel 11. The spiral pulse generator 13 is accommodated with the spark gap 15 and the charging resistor 16 in the outer bulb.

Figure 4:
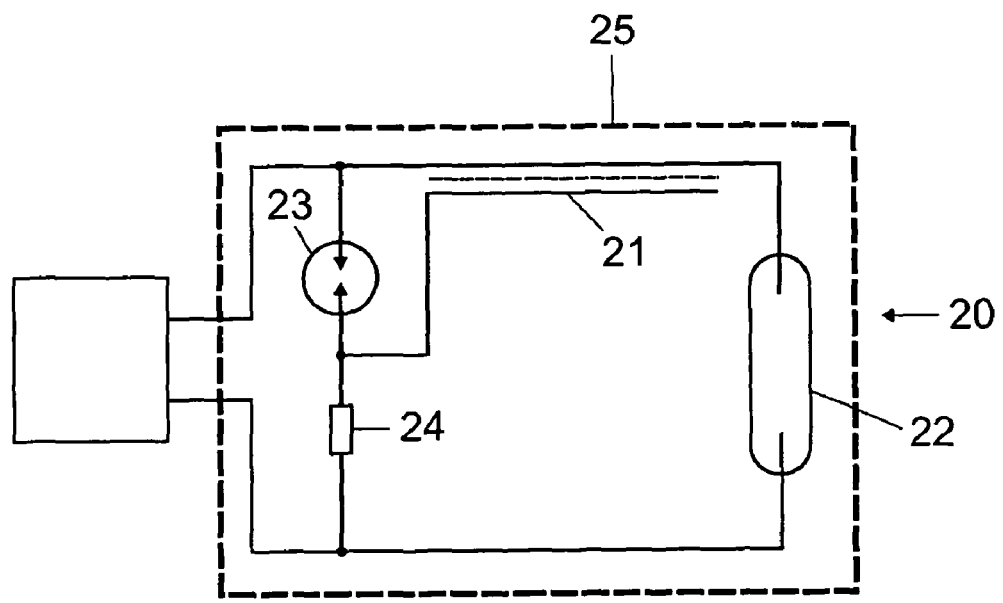
FIG. 4 shows the basic design of a high-pressure discharge lamp with superimposition ignition, with a spiral pulse generator in the outer bulb.

FIG. 4 shows the basic design of a high-pressure discharge lamp, in particular a metal-halide lamp 20, with an integrated spiral pulse generator 21, with no ignition electrode being fitted on the outside on the discharge vessel 22, which can be manufactured from quartz glass or ceramic. The spiral pulse generator 21 is accommodated with the spark gap 23 and the charging resistor 24 in the outer bulb 25. The high-voltage pulse is superimposed on the operating voltage of the lamp and supplied via a main electrode.

Figure 5:
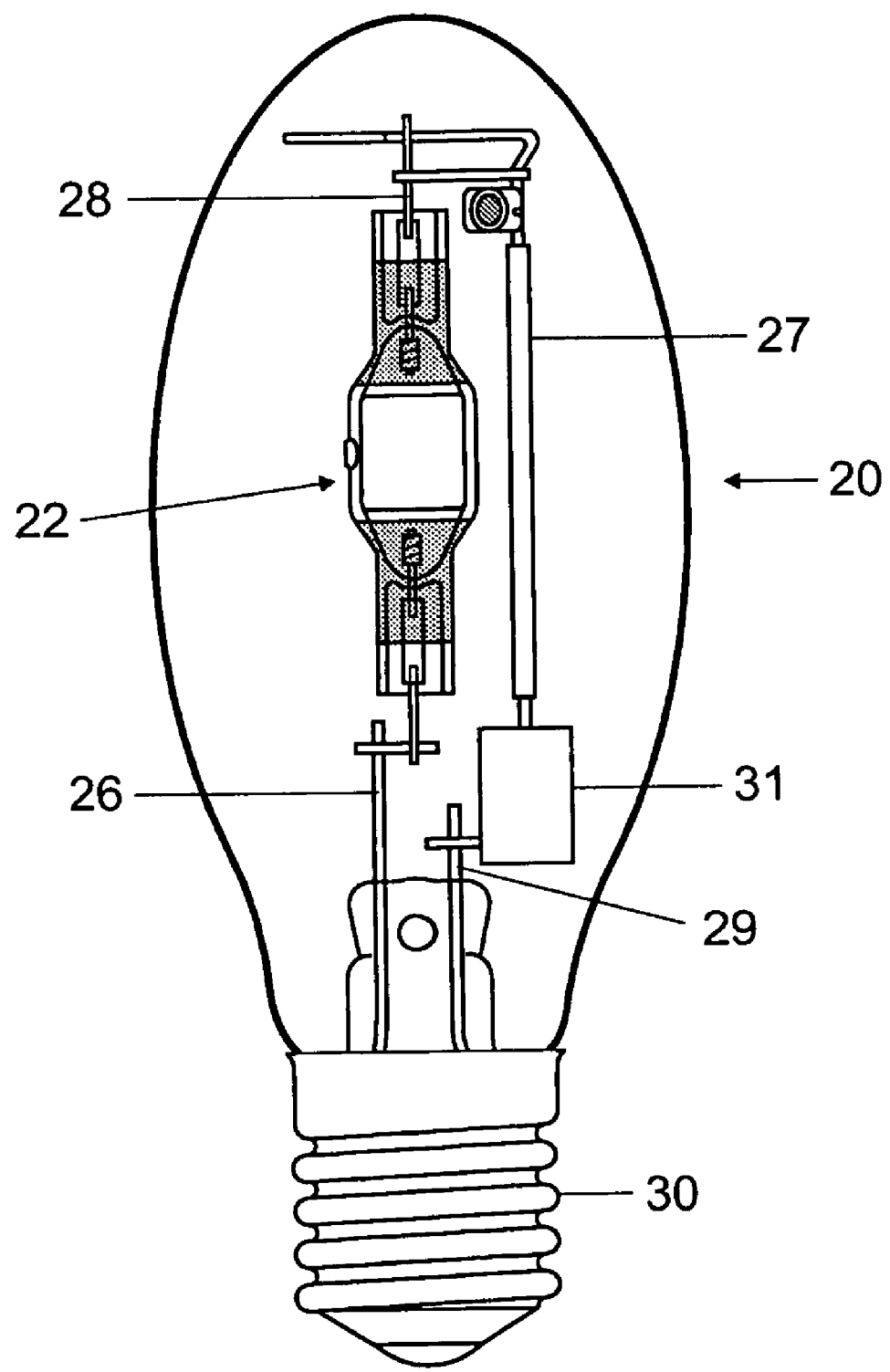
FIG. 5 shows a metal-halide lamp with a spiral pulse generator in the outer bulb.

FIG. 5 shows a metal-halide lamp 20 with a discharge vessel 22, which is held by two feed lines 26, 27 in an outer bulb. The first feed line 26 is a wire with a short section bent back. The second feed line 27 is substantially a bar, which leads to the leadthrough 28 remote from the base. An ignition unit 31, which contains the spiral pulse generator, the spark gap and the charging resistor, is arranged between the feed line 29 out of the base 30 and the bar 27, as indicated in FIG. 4.

Figure 6:
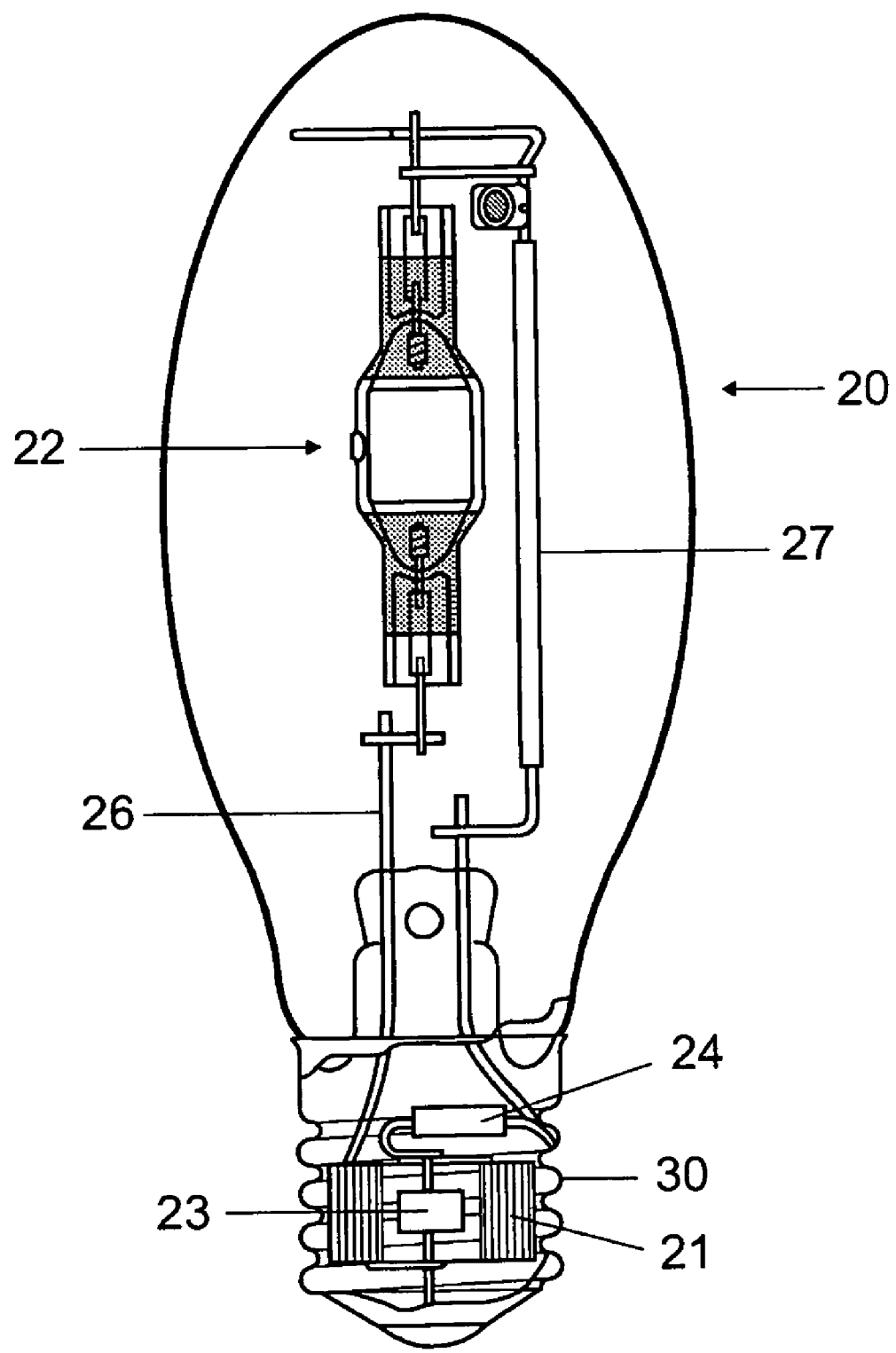
FIG. 6 shows a metal-halide lamp with a spiral pulse generator in the base.

FIG. 6 shows a metal-halide lamp 20 similar to that in FIG. 5 with a discharge vessel 22, which is held by two feed lines 26, 27 in an outer bulb 25. The first feed line 26 is a wire with a short section bent back. The second feed line 27 is substantially a bar, which leads to the leadthrough 28 remote from the base. In this case, the ignition unit is arranged in the base 30, to be precise both the spiral pulse generator 21 and the spark gap 23 and the charging resistor 24.

Figure 7:
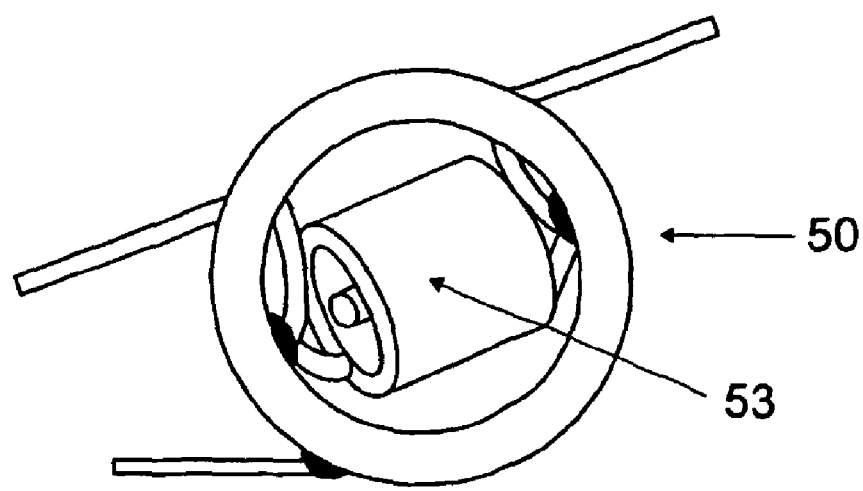
FIG. 7 shows a spiral pulse generator with a spark gap incorporated.

FIG. 7 shows the physical implementation of a spiral pulse generator 50 with an integrated spark gap 53. It has two electrical terminals in the interior on the spark gap 53 and one terminal on the outer circumference.

Figure 8:
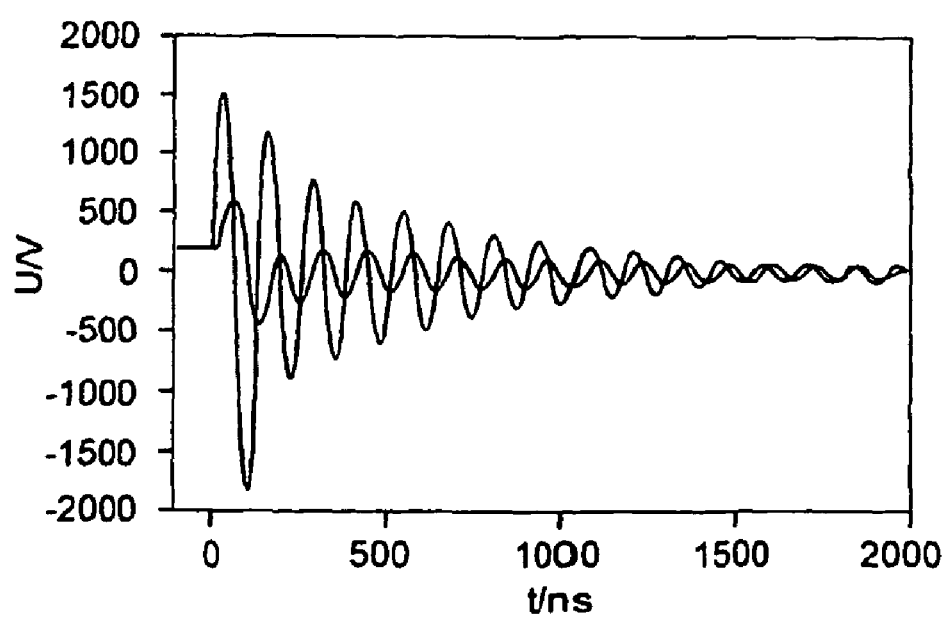
FIG. 8 shows a measurement of the resultant output voltage as a function of time for a typical spiral pulse generator.

FIG. 8 shows the measurement of the output voltage $U_{out}$ on a ceramic spiral pulse generator with an input voltage of 230 V in the short circuit. The output voltage $U_{out}$ is represented as a function of time t (in ns). The maximum output voltage is in this case −1850 V, by way of example.

This technology can also be used for lamps without electrodes, it being possible for the spiral pulse generator to act as ignition aid.

Further applications of this compact high-voltage pulse generator involve the ignition of other devices. The application is primarily advantageous in so-called magic spheres, in the generation of X-ray pulses and the generation of electron beam pulses. A use in motor vehicles as a replacement for the conventional ignition coils is also possible.

In this case, turns numbers of n up to 500 are used so that the output voltage of up to the order of magnitude of 100 kV is achieved. This is because the output voltage $U_A$ is given, as a function of the charging voltage $U_L$, by $U_A = 2 \times n \times U_L \times \eta$, with the efficiency η being given by $\eta = (AD-ID)/AD$.

The invention is associated with particular advantages in interaction with high-pressure discharge lamps for automobile headlamps which are filled with xenon under a high pressure of preferably at least 3 bar and metal halides. These are particularly difficult to ignite since the ignition voltage is more than 10 kV as a result of the high xenon pressure. At present attempts are being made to accommodate the components of the ignition unit in the base. A spiral pulse generator with an integrated charging resistor can be accommodated either in the base of the motor vehicle lamp or in an outer bulb of the lamp.

The invention involves very particular advantages in interaction with high-pressure discharge lamps which do not contain any mercury. Such lamps are particularly desirable for environmental protection reasons. They contain a suitable metal halide filling and in particular a noble gas such as xenon under high pressure. As a result of the lack of mercury, the ignition voltage is particularly high. It is typically at least 5 kV, but may also be more than 20 kV. At present attempts are being made to accommodate the components of the ignition unit in the base. A spiral pulse generator with an integrated charging resistor can be accommodated either in the base of the mercury-free lamp or in an outer bulb of the lamp.

The invention claimed is:

1. A compact high-voltage pulse generator based on a spiral pulse generator, wherein the spiral pulse generator is in the form of low temperature co-firing ceramic (LTCC) assembly or high temperature co-firing ceramic (HTCC) assembly comprising ceramic films and metallic conductive paste and wherein the ceramic film uses at least one material from the group consisting of the titanates or niobates, the bismuth-based perovskites or the tungsten bronzes.

2. The high-voltage pulse generator as claimed in claim 1, wherein the spiral comprises at least n=5 turns and preferably at most n=500 turns.

3. The high-voltage pulse generator as claimed in claim 1, wherein the dielectric constant of the material is selected to be between 3 and 21 000, preferably between 5 and 20 000.

4. An ignition unit based on a high-voltage pulse generator which is itself based on a spiral pulse generator, wherein the spiral pulse generator is in the form of a low temperature co-firing ceramic (LTCC) assembly or an high temperature co-firing ceramic (HTCC) assembly comprising ceramic films and metallic conductive paste and wherein the ceramic film uses at least one material from the group consisting of the titanates or niobates, the bismuth-based perovskites or the tungsten bronzes, wherein it furthermore comprises at least one charging resistor and a switch.

5. A high pressure discharge lamp which includes a high-voltage pulse generator based on a spiral pulse generator, wherein the spiral pulse generator is in the form of an low temperature co-firing ceramic (LTCC) assembly or high temperature co-firing ceramic (HTCC) assembly comprising ceramic films and metallic conductive paste and wherein the ceramic film uses at least one material from the group consisting of the titanates or niobates, the bismuth-based perovskites or the tungsten bronzes.

* * * * *